(12) United States Patent
Kiendl et al.

(10) Patent No.: US 11,555,857 B2
(45) Date of Patent: Jan. 17, 2023

(54) METHOD AND APPARATUS FOR MONITORING THE WEAR OF A LONG STATOR LINEAR MOTOR SYSTEM

(71) Applicant: KRONES AG, Neutraubling (DE)

(72) Inventors: Thomas Kiendl, Maxhuette-Haidhof (DE); Hartmut Davidson, Zeitlarn (DE); Stefan Elsperger, Soechtenau (DE)

(73) Assignee: KRONES AG, Neutraubling (DE)

( * ) Notice: Subject to any disclaimer, the term of this patent is extended or adjusted under 35 U.S.C. 154(b) by 85 days.

(21) Appl. No.: 17/252,690

(22) PCT Filed: Feb. 18, 2019

(86) PCT No.: PCT/EP2019/053916
§ 371 (c)(1),
(2) Date: Dec. 15, 2020

(87) PCT Pub. No.: WO2019/238276
PCT Pub. Date: Dec. 19, 2019

(65) Prior Publication Data
US 2021/0116509 A1 Apr. 22, 2021

(30) Foreign Application Priority Data

Jun. 15, 2018 (DE) .................... 10 2018 209 723.2

(51) Int. Cl.
*G01R 31/00* (2006.01)
*G01R 31/34* (2020.01)
*H02K 41/03* (2006.01)

(52) U.S. Cl.
CPC ......... *G01R 31/343* (2013.01); *H02K 41/031* (2013.01)

(58) Field of Classification Search
CPC ............................ G01R 31/343; H02K 41/031
See application file for complete search history.

(56) References Cited

U.S. PATENT DOCUMENTS

2014/0320058 A1* 10/2014 Takagi ................ H02K 41/031
318/632
2017/0346380 A1* 11/2017 Weber .................... B60L 15/38

FOREIGN PATENT DOCUMENTS

| DE | 102013218389 A1 | 3/2015 |
| JP | S64000440 A | 1/1989 |
| JP | H04054403 A | 2/1992 |

OTHER PUBLICATIONS

ISA European Patent Office, International Search Report Issued in Application No. PCT/EP2019/053916, dated Apr. 18, 2019, WIPO, 4 pages.

* cited by examiner

*Primary Examiner* — Alesa Allgood
(74) *Attorney, Agent, or Firm* — McCoy Russell LLP

(57) ABSTRACT

A method and an apparatus are described for monitoring the wear of a long stator linear motor system comprising at least one motor train with stators and at least one transport vehicle that is driven electromagnetically thereby. Due to the fact that a force exerted electromagnetically and/or mechanically upon said motor train by the transport vehicle transverse to the latter's direction of transport or a differential force exerted in such manner by the transport vehicle upon two oppositely disposed motor trains is measured using sensors, changes in the forces between the motor train and the vehicle caused by dimensional tolerances and/or wear can be detected in order to prevent a malfunction of the track switch.

17 Claims, 5 Drawing Sheets

METHOD AND APPARATUS FOR MONITORING THE WEAR OF A LONG STATOR LINEAR MOTOR SYSTEM

CROSS REFERENCE TO RELATED APPLICATIONS

The present application is a U.S. National Phase of International Application No. PCT/EP2019/053916 entitled "METHOD AND APPARATUS FOR MONITORING THE WEAR OF A LONG-STATOR LINEAR MOTOR SYSTEM," and filed on Feb. 18, 2019. International Application No. PCT/EP2019/053916 claims priority to German Patent Application No. 10 2018 209 723.2 filed on Jun. 15, 2018. The entire contents of each of the above-listed applications are hereby incorporated by reference for all purposes.

TECHNICAL FIELD

The invention relates to a method and an apparatus for monitoring the wear of a long stator linear motor system according to the preamble of claims 1 and 7.

BACKGROUND AND SUMMARY

Transport systems with long stator linear motors and transport vehicles (shuttles) individually driven by them, as well as dynamic magnetic track switches for distributing the transport vehicles to different transport lanes, are basically known, for example, from DE 10 2013 218 389.

The function of the magnetic track switches is based on the principle that current flow through the laterally arranged stators in the track switch region generates a pull force or a push force acting in the transverse direction upon the respective vehicle/shuttle and/or reduces a pulling normal force. This can be changed in a selected manner in order to direct individual vehicles/shuttles to the assigned transport lane.

Transverse forces that are as uniform as possible are required for reliable track switch function, in particular normal forces, such as, for example, by reluctance. The normal forces depend on various parameters such as the width of the magnetic air gap and the magnetization of the magnetic reaction elements on the respective transport vehicle.

Due to manufacturing tolerances and operational wear of the vehicle rollers, different air gap dimensions can arise on either side of the vehicle/shuttle that is configured symmetrically in terms of drive technology. The problem there is that symmetrical gap dimensions are of crucial importance for reliable track switch function Asymmetries of a few tenths of a millimeter can lead to uncontrolled lateral forces or normal forces that are higher than the actuating forces of the track switches. This then leads to malfunction of the track switch. The motor operation with motor segments attached on one side is also changed, since the air gap influences the motor properties such as the force factor and the back electromotive force (bemf).

There is therefore is a need for predictive monitoring of the wear of track switch-enabled long stator linear motor systems, in particular for the prevention of track switch malfunction but also during normal motor operation. In other words, faulty vehicles/shuttles, in particular those with worn rollers, are to be identified and replaced or repaired as early as possible.

The object given is satisfied by a method according to claim 1. According thereto, it is used to monitor the wear of a long stator linear motor system comprising at least one motor train with stators and at least one transport vehicle that is electromagnetically driven thereby. According to the invention, a force exerted electromagnetically and/or mechanically upon the motor train by the transport vehicle transverse to the latter's direction of transport or a differential force exerted in such manner by the transport vehicle upon two oppositely disposed motor trains is measured using sensors.

Monitoring is possible continuously during operation or the product flow, respectively. For example, a normal force between the transport vehicle and the motor train can be continuously measured and evaluated during operation using a force sensor. This can be done on a single side, in which case the absolute normal force is measured, and on both sides, in which case a differential normal force is then determined. The forces measured can subsequently be examined for critical values.

Transverse forces increasing on one side over time indicate wear on the rollers of the transport vehicle. An impending malfunction can be predicted in this way, in particular for the reason that the distance of the transport vehicle from a motor train is too small.

The force/differential force is preferably a transverse force, in particular a normal force, exerted electromagnetically by the transport vehicle upon a stator of the motor train. This allows for a direct conclusion about the gap width between the stator and the magnetic reaction element of the transport vehicle.

The force is preferably a transverse force, in particular a normal force, exerted mechanically by the transport vehicle upon a guide rail of the motor train. The transverse force is then transmitted from the rollers of the transport vehicle to the guide rail and also allows for a reliable conclusion about the gap width between the stator and the magnetic reaction element of the transport vehicle.

The force/differential force measured preferably represents an actual value and as such is compared to a permissible maximum value. This enables an ongoing assessment of the probability of an impending malfunction and possibly also a trend analysis of the probability.

The maximum permissible value is preferably smaller than a minimum transverse actuating force of a track switch formed on the long stator linear motor system for the transport vehicle. In this way, an impending malfunction of the track switch can be predicted with the aim of replacing and/or repairing faulty transport vehicles in good time. It is preferably verified by a machine whether the force/differential force measured is in a permissible working range of the motor system defined between a permissible maximum value and a permissible minimum value. For example, a processing unit associated with the long stator motor system compares at least one measured actual value to a predetermined setpoint range that corresponds to the permissible working range.

In other words, the force/differential force measured for correct operation of the long stator motor system is to deliver a permissible measured value which is between a predetermined upper and lower limit. This enables the motor system to operate correctly in the long term, even without a track switch.

The force/differential force measured is preferably a measure of the width of a distance, in particular a gap, between a stator of the motor train in the region of the force measurement and a magnetic reaction element of the transport vehicle. This allows for a conclusion about the wear on the rollers.

The object posed is also satisfied by an apparatus according to claim 7. According thereto, it is used to monitor the wear of a long stator linear motor system and comprises at least one motor train with stators and at least one transport vehicle that is electromagnetically driven thereby. According to the invention, the apparatus further comprises a measuring device attached in particular to the motor train for measuring a force exerted upon the motor train by the transport vehicle transverse to the latter's direction of transport. The same advantages are obtained as with the method according to the invention.

The motor train preferably comprises a frame and at least one stator mounted thereon, and the measuring device comprises at least one load cell which is arranged between the stator and the frame for measuring an electromagnetic pull force acting upon the stator. This enables simple force measurement by pulling apart the load cell between the stator and the frame or the like.

The motor train preferably comprises a frame and a guide rail mounted thereon, the transport vehicle comprises rollers running laterally therealong, and the measuring device comprises at least one load cell which is arranged between the guide rail and the frame for measuring a pressing force acting upon the guide rail. This enables various force measurements by pressing together, pulling apart, or sliding attachment elements of the load cell between the guide rail and the frame.

The measuring device preferably comprises at least one load cell inserted in a force-fit manner between a frame of the motor train and a stator and/or between the frame and a lateral guide rail for the transport vehicle. Load cells are reliable and economical for permanent monitoring during production operations.

Two motor trains are preferably formed with a measuring device on either side of the transport vehicle for measuring a differential force exerted upon the motor trains by the transport vehicle transverse to its direction of transport. This is particularly informative for monitoring the entry regions of track switches.

The motor train is preferably located in the entry region to a track switch of the long stator linear motor system. Disposed in this region are motor trains on either side of the transport vehicle, the exerted transverse force of which is decisive for the correct switching function of the track switch. The operability of the track switch can thus be assessed reliably.

The measuring device is preferably arranged in a rectilinear section of the motor train. In the ideal case, symmetrical transverse forces arise there on both sides of the transport vehicle and therefore a differential normal force ideally equal to zero. Monitoring is particularly easy and informative there.

The measuring device is preferably configured to measure a lateral normal force. This simplifies the reliable estimation of the gap width and the prediction of the track switch function by comparison to the associated actuating force.

The apparatus preferably also comprises a processing unit for comparing an actual value measured to the measuring device with a setpoint value or setpoint range, in particular with a permissible maximum value, a force acting upon the motor train transverse to the direction of transport and/or a differential force acting upon oppositely disposed motor trains. This enables a wide range of evaluations, both with regard to the actual state as well as trend analyzes based thereon.

BRIEF DESCRIPTION OF THE FIGURES

Preferred embodiments of the invention are shown by way of drawings, where.

DETAILED DESCRIPTION

Figure 1:
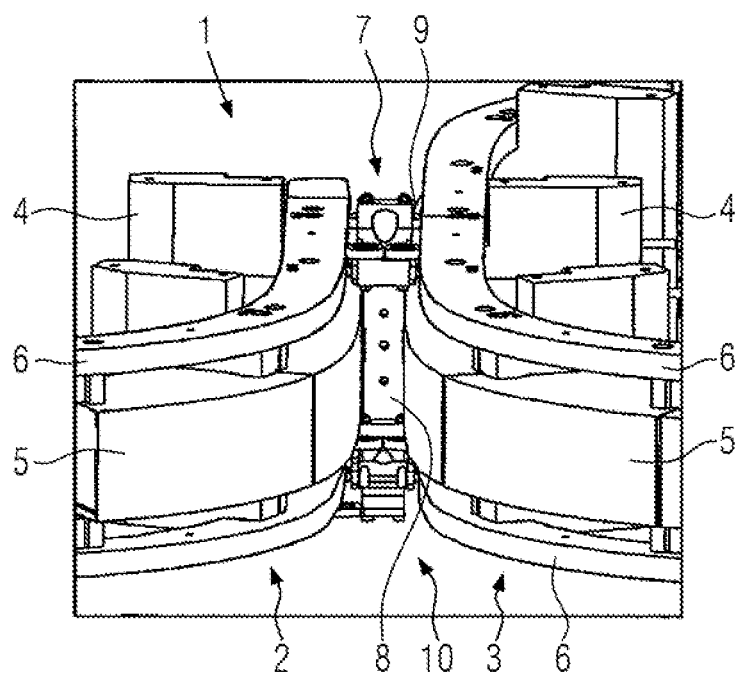
FIG. 1 shows a view into a track switch of the long stator linear motor system.
Figure 2:
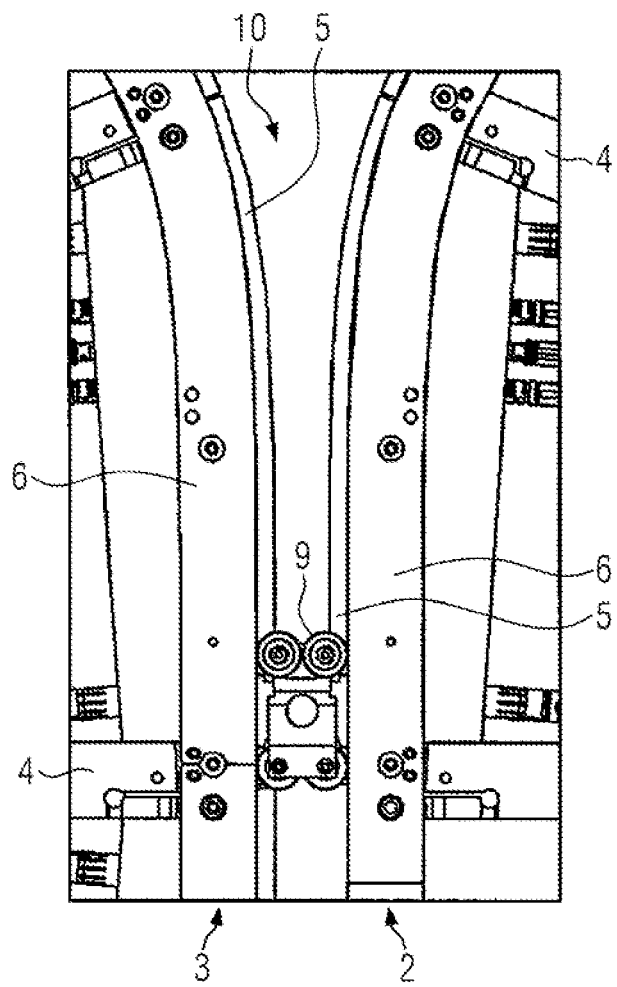
FIG. 2 shows a top view onto the entry region of the track switch.

FIGS. 1 and 2 show a section of a long stator linear motor system 1 with oppositely disposed motor trains 2, 3, each comprising a frame 4 and electromagnetic stators 5 attached thereto as well as lateral guide rails 6 for a transport vehicle 7 (shuttle). Transport vehicle 7 comprises magnetic reaction elements 8 interacting with stators 5 and rollers 9 running along guide rails 6. These components of long stator linear motor systems 1 are used to transport containers or similar product components in filling systems, are known per se, and shall therefore not be further explained below.

A track switch 10 can also be seen in FIGS. 1 and 2 downstream of which the transport path for transport vehicle 7 continues either along the one motor train 2 or the other motor train 3. With a suitable current flow through stators 5 of respectively activated motor train 2 or 3, transport vehicle 7 is pulled laterally so firmly that it continues to be guided along activated motor train 2, 3 even downstream of track switch 10. This is also known per se.

Figure 3:
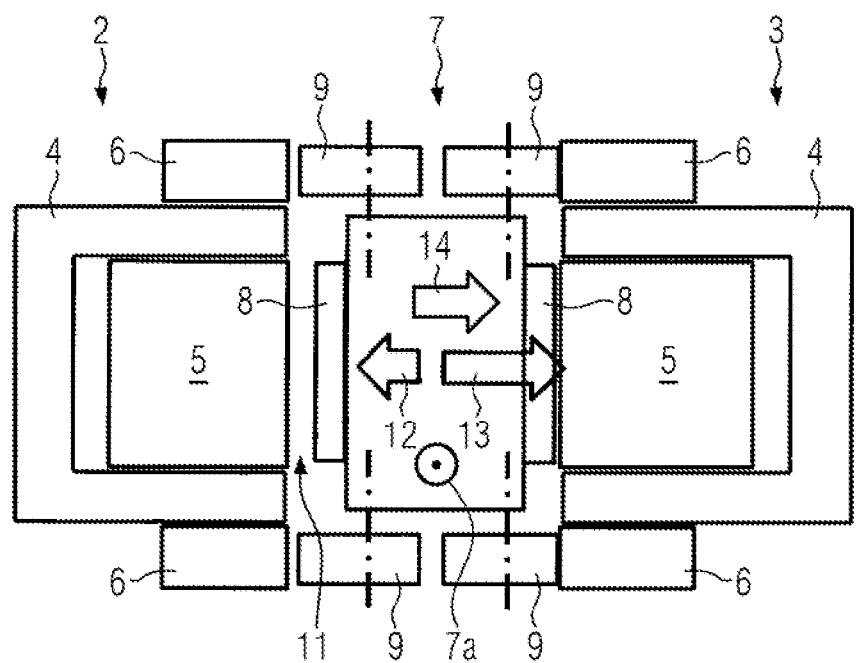
FIG. 3 shows a schematic cross section through a long stator linear motor system to illustrate the underlying problem.

As illustrated in principle in FIG. 3, depending on the width of an air gap 11 effective between stator 5 and magnetic reaction element 8, a pulling force 12, 13 acts between transport vehicle 7 and respective motor train 2, 3. The wider air gap 11, the smaller force 12, 13 and vice versa. Mutually opposing forces 12, 13 can be measured in absolute terms and result in a differential force 14 that can be calculated therefrom.

Forces 12, 13, 14 are transverse forces and in particular normal forces in relation to direction of transport 7a of transport vehicle 7.

Figure 4:
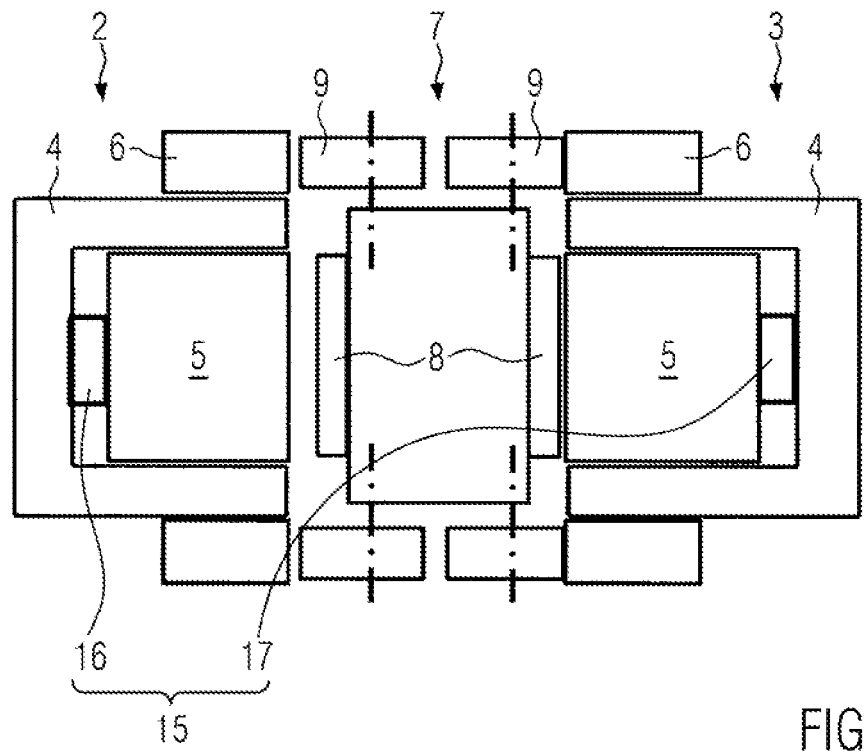
FIG. 4 shows a schematic cross-section through a first embodiment of the measuring device.

The embodiment according to FIG. 4 comprises a measuring device 15 with a first load cell 16 for measuring force 12 and/or with a second load cell 17 for measuring force 13 in the opposite direction. Load cells 16, 17 are each attached to frame 4 and to stator 5, in particular, disposed therebetween, of associated motor train 2, 3. Load cells 16, 17 then measure tensile forces between frame 4 and stators 5. In other words, stator 5 is then preferably attached to frame 4 by way of load cells 16, 17.

Measuring device 15 preferably detects differential force 14 which acts on motor trains 2, 3. This variant of measuring is possible in the parallel travel region upstream of track switch 10 and/or within a special monitoring segment with rectilinear motor trains 2, 3 on either side. Measurement of force 12, 13 on a single side is also possible on a free-standing or one-sided segment of long stator linear motor system 1.

Figure 5:
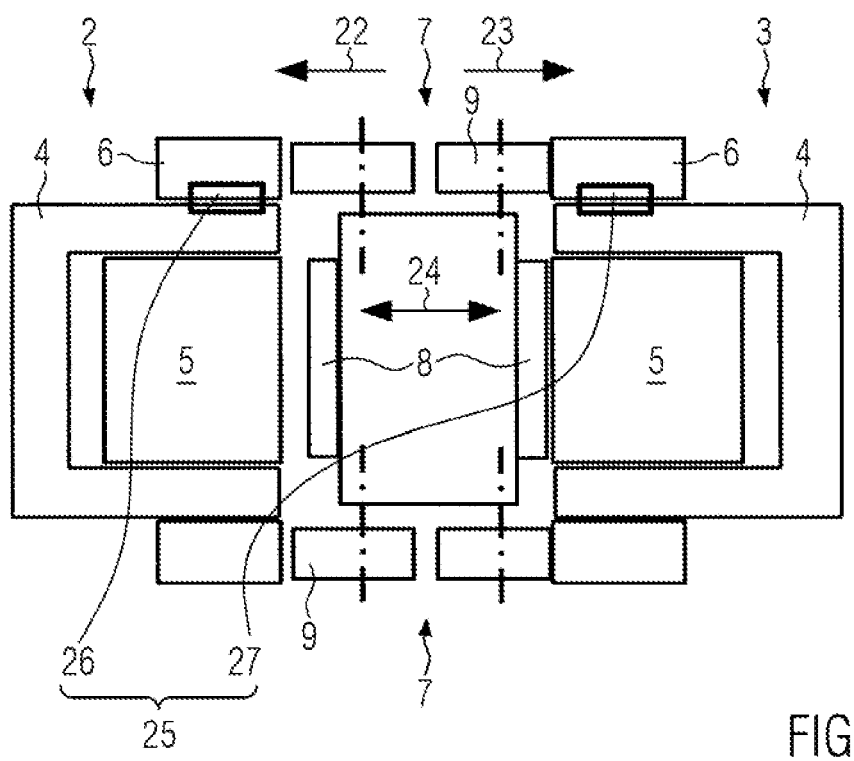
FIG. 5 shows a schematic cross-section through a second embodiment of the measuring device.

The embodiment according to FIG. 5 is used to measure a force 22, 23 with which rollers 9 press against associated guide rail 6. Force 22, 23 acts in normal force direction 24 between transport vehicle 7 and respective motor train 2, 3.

For this purpose, a measuring device 25 with a first load cell 26 for measuring force 22 and/or with a second load cell 27 for measuring force 23 in the opposite direction is present. Load cells 26, 27 are each attached to frame 4 and to guide rail 6, in particular, disposed therebetween, of associated motor train 2, 3 and measure, for example, a thrust or pressing force between frame 4 and guide rail 6. This means that a normal force applied upon guide rail 6, which is directed as though guide rail 6 were pushed away, is measured.

Measuring device 25 then preferably detects force 22 or 23 acting directly in normal force direction 24 upon respective guide rail 6. Differential measurement is then not required. This variant of measuring is possible in the parallel travel region upstream of track switch 10 and/or within a special monitoring segment with rectilinear motor trains 2, 3 on either side. Measurement of force 22, 23 on a single side is also possible on a free-standing segment of long stator linear motor system 1.

It is possible to infer progressive and/or critical wear of rollers 9 or other deviations from the target state of long stator linear motor system 1 from measured forces 12, 13, 14, 22, 23.

The invention therefore allows for a direct representation of the current force situation between transport vehicles 7 and motor trains 2, 3, which is decisive for reliable prediction of track switch functions based on their triggering actuating forces.

Consequently, the present invention enables increased process reliability for track switches 10 and a reduction of spontaneously occurring error states of the transport system as a whole. Transport vehicles 7 and/or individual components, in particular their rollers 9, can be replaced as required and therefore in an economical manner.

Functionally critical transport vehicles 7 can be recognized and then replaced manually. An automated variant is also possible in which functionally critical transport vehicles 7 are diverted by way of a track switch and rebuilt or new transport vehicles 7 are introduced as replacements.

Further options for monitoring wear that are not according to the invention shall be described below.

Vibrations, for example, which the transport vehicle transmits to the guide rails can be measured as an indication of roller wear. A single side variant is also conceivable there. For example, vibration sensors (not shown) are then attached to the guide rails Since roller wear on the transport vehicle causes the guide rails to vibrate in a defined manner, they can be recorded by the vibration sensors. The wear of the rollers can be monitored with digital evaluation of the vibrations in terms of frequency range and amplitude.

It is also possible to measure roller wear, on the basis of which conclusions can be drawn as to a changed force situation between the transport vehicles and the motor trains.

Alternatively, direct measurement of the air gap between the stator and the magnetic reaction element of the vehicle is also conceivable as a measure of the resulting normal force, for example, by way of a travel path measurement with ultrasound, laser light, or the like.

In combination with at least one embodiment of the present invention described above or also by itself, a further monitoring method for controlling wear of a long stator linear motor system can be used which is based on a measurement of induced voltages.

Such a method is used to monitor the wear of a long stator linear motor system with at least one motor train with stators and at least one transport vehicle that is driven electromagnetically thereby.

Furthermore, a voltage induced by the moving transport vehicle is measured in at least one coil winding of the stators by magnetic reaction elements formed thereon.

The level of this voltage depends on the width of the air gap that is effective between the stator and the magnetic reaction element. The wider the air gap, the smaller the voltage measured in this way and vice versa.

The width of the air gap can be inferred from the voltage measured, taking into account other parameters influencing the voltage measured such as in particular the relative speed of the reaction elements with respect to the stators and/or the magnetic field strength of the reaction elements.

Dropping below a predetermined minimum width and/or a specific temporal progression of an increasing narrowing of the air gap can then be used as an assessment criterion for the wear of the long stator linear motor system.

The voltage induced can be measured and evaluated by the motor electronics of the long stator linear motor system.

The speed of the transport vehicle can be detected by separate position detection, for example, by an independent sensor system. The internally installed position sensors are typically used for position detection. This gives rise to the possibility to compensate for the speed as an influencing variable in the voltage measurement and to only detect the parameters relevant for monitoring the wear.

The voltage measured or a value of the normal force that can be calculated therefrom can then be compared to critical values.

A respective apparatus for monitoring the wear of a long stator linear motor system comprises at least one motor train with stators and at least one transport vehicle that is electromagnetically driven thereby. Furthermore, a measuring device is present for measuring a voltage in at least one coil winding of the stators induced by the moving transport vehicle by way of magnetic reaction elements formed thereon.

The apparatus then comprises, for example, a processing unit for evaluating the voltages measured as described above with regard to the method.

Figure 6:
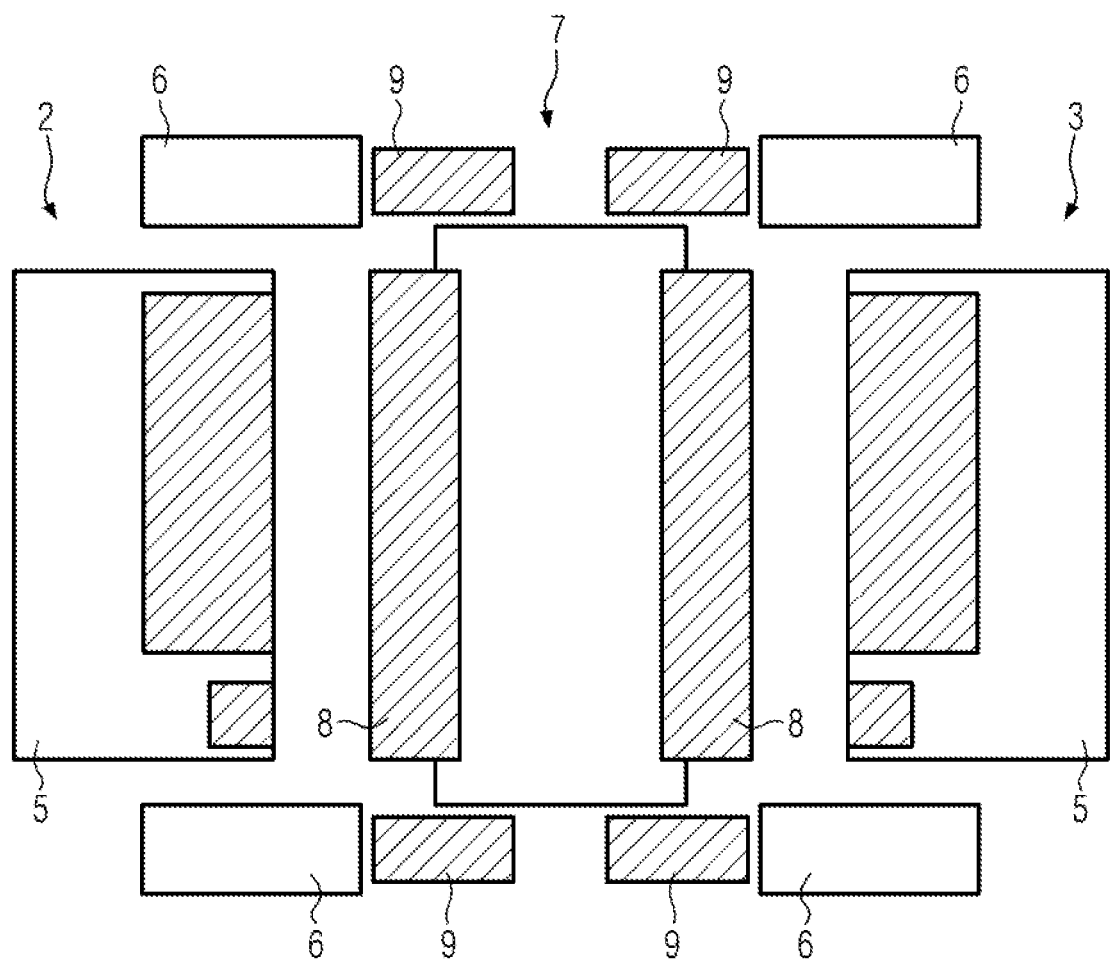
FIG. 6 shows a schematic cross-section through a third embodiment of the measuring device.
Figure 7:
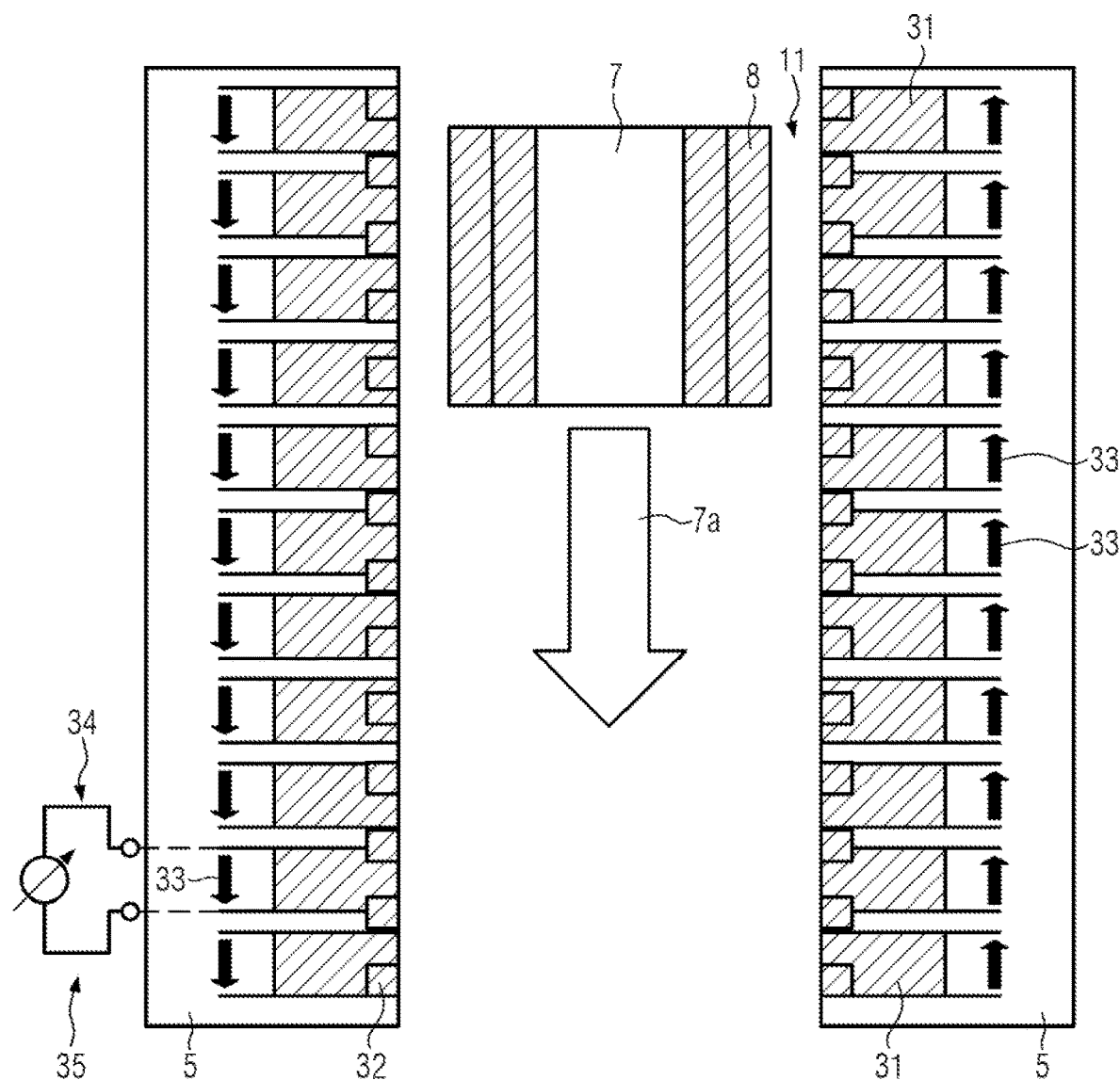
FIG. 7 shows a schematic section through the fourth embodiment seen from above.

FIGS. 6 and 7 schematically show a section of long stator linear motor system 1 with a third embodiment of a measuring device for monitoring the wear of the rollers based on the above-mentioned voltage measurement.

Motor trains 2, 3 disposed opposite one another are attached to a frame (not shown) and comprise electromagnetic stators 5 and lateral guide rails 6 for transport vehicles 7 (shuttles). Transport vehicles 7 each comprise magnetic reaction elements 8 interacting with stators 5, preferably permanent magnets, as well as rollers 9 running along guide rails 6, as has already been described for the other embodiments.

In a manner basically known, stators 5 comprise a plurality of electromagnetic coils 31 lined up in direction of transport 7a. Furthermore, a plurality of position sensors 32 lined up in direction of transport 7a is present in the region of stators 5. A measuring device 35 is also provided for the successive measurement of an electrical voltage 33 induced in individual coils 31 and/or an electrical current 34 flowing as a result, and is only indicated schematically.

Wear monitoring of long stator linear motor system 1 can be carried out therewith, for example, as follows.

Magnetic reaction elements 8 (permanent magnets) of transport vehicle 7 induce a voltage 33 in individual coils 31 depending on the actual speed of respective transport vehicle 7.

The level of voltage 33 induced in this manner depends inter alia on the strength of reaction elements 8 (permanent magnets), on the speed of transport vehicle 7, and on air gap 11 between respective coil 31 and transport vehicle 7.

Coils 31 can there be used at the same time to drive transport vehicle 7.

Induced voltage 33 and/or induced current 34 can be measured at the contacts of coils 31.

The actual position and speed of transport vehicle 7 can be determined by reading out position sensors 32.

A nominally induced voltage can be calculated for air gaps 11 of different widths from such position and/or speed information and the control behavior of the control electronics associated with the stator Known methods, such as those used for power converters, can in principle be used to calculate the nominally induced voltage.

By comparing calculated and measured voltages 33, the width of air gap 11 actually present can then be determined.

Information about electromagnetic properties of long stator linear motor system 1, such as the strength of reaction elements 8 (permanent magnets), which may be necessary for this, is available on the basis of conventional device data.

Both a method for absolute inductive measurement of air gap 11 and a method that monitors the relative change in the width of air gap 11 starting out from an initial value are possible.

As an alternative or in addition to the methods described above, predefined test cycles with defined reduced track switch actuation forces are also conceivable. The long stator linear motor system then performs a test run in an automated manner without product and under defined conditions every time the system is switched on or at regular intervals. In this case, track switches are triggered with reduced switch actuation forces, whereby critical transport vehicles can be recognized by fault activation and be replaced manually or discharged in an automated manner.

The invention claimed is:

1. A method for monitoring wear of a long stator linear motor system with at least one motor train with stators and at least one transport vehicle that is driven electromagnetically thereby, wherein a force exerted electromagnetically and/or mechanically upon said motor train by said transport vehicle transverse to a latter's direction of transport or a differential force exerted in such manner by said transport vehicle upon two oppositely disposed motor trains is measured by sensors, where said measured force/differential force is compared to a permissible maximum value.

2. The method according to claim 1, where said force/differential force is a transverse force, in particular a normal force, exerted electromagnetically by said transport vehicle upon a stator of said motor train.

3. The method according to claim 1, where said force is a transverse force, in particular an actual normal force, exerted mechanically by said transport vehicle upon a guide rail of said motor train.

4. The method according to claim 1, where said permissible maximum value is preferably smaller than a minimum transverse actuating force of a track switch formed on said long stator linear motor system for said transport vehicle.

5. The method according to claim 1, where it is examined whether said measured force/differential force is within a permissible working range of said long stator linear motor system defined between the permissible maximum value and a permissible minimum value.

6. The method according to claim 1, where said measured force/differential force is a measure of a width of a distance, in particular a gap, between a stator of said motor train in a region of a force measurement and a magnetic reaction element of said transport vehicle.

7. An apparatus for monitoring wear of a long stator linear motor system, with at least one motor train with stators and at least one transport vehicle which is electromagnetically driven thereby, wherein a measuring device attached to said motor train for measuring a force exerted upon said motor train by said transport vehicle transverse to the latter's direction of transport, and where two motor trains are formed with a measuring device on either side of said transport vehicle for measuring two forces exerted upon said motor trains in an opposite direction by said transport vehicle transverse to a latter's transport direction or a differential force arising therefrom, the apparatus further comprising a processing unit for comparing an actual value measured with said measuring device to a permissible maximum value of a force acting transverse to said direction of transport upon said motor train or of a differential force acting upon said motor trains.

8. The apparatus according to claim 7, where said motor train comprises a frame and at least one stator mounted thereon, where said measuring device comprises at least one load cell which is arranged on said stator and on said frame for measuring an electromagnetic pull force acting upon said stator.

9. The apparatus according to claim 7, where said motor train comprises a frame and a guide rail mounted thereon and said transport vehicle comprises rollers running laterally therealong, and where said measuring device comprises at least one load cell which is arranged between said guide rail and said frame for measuring a pressing force acting upon said guide rail.

10. The apparatus according to claim 7, where said measuring device comprises at least one load cell inserted in a force-fit manner between a frame of said motor train and a stator and/or between said frame and a lateral guide rail for said transport vehicle.

11. The apparatus according to claim 7, where said motor train is located in an entry region to a track switch of said long stator linear motor system.

12. The apparatus according to claim 7, where said measuring device is arranged in a rectilinear section of said motor train.

13. The apparatus according to claim 7, where said measuring device is configured to measure a lateral normal force.

14. The apparatus according to claim 7, where said permissible maximum value is preferably smaller than a minimum transverse actuating force of a track switch formed on said long stator linear motor system for said transport vehicle.

15. The apparatus according to claim 7, where it is examined whether said measured force/differential force is within a permissible working range of said long stator linear motor system defined between the permissible maximum value and a permissible minimum value.

16. The apparatus according to claim 7, where said measured force/differential force is a measure of a width of a distance, in particular a gap, between a stator of said motor train in a region of a force measurement and a magnetic reaction element of said transport vehicle.

17. An apparatus for monitoring the wear of a long stator linear motor system, with at least one motor train with stators and at least one transport vehicle which is electromagnetically driven thereby, wherein a measuring device is attached to said motor train for measuring a force exerted upon said motor train by said transport vehicle transverse to the latter's direction of transport, where said motor train is located in an entry region to a track switch of said long stator linear motor system, and further comprising a processing unit for comparing an actual value measured with said measuring device to a setpoint range, in particular to a permissible maximum value, of a force acting transverse to said direction of transport upon said motor train or of a differential force acting upon said motor trains.

* * * * *